United States Patent [19]

Kim et al.

[11] Patent Number: 4,599,790
[45] Date of Patent: Jul. 15, 1986

[54] PROCESS FOR FORMING A T-SHAPED GATE STRUCTURE

[75] Inventors: Bumman Kim, Richardson; Paul Saunier, Garland, both of Tex.

[73] Assignee: Texas Instruments Incorporated, Dallas, Tex.

[21] Appl. No.: 696,299

[22] Filed: Jan. 30, 1985

[51] Int. Cl.$^4$ ........................................... H01L 21/285
[52] U.S. Cl. ........................................ 29/571; 29/579; 29/591; 357/15; 357/22; 148/DIG. 143
[58] Field of Search .................... 29/571, 591, 579; 357/15, 22, 68; 148/DIG. 143

[56] References Cited

U.S. PATENT DOCUMENTS 4,536,942  8/1985  Chao et al. ............................ 29/571
4,551,905  11/1985  Chao et al. ............................ 29/571

*Primary Examiner*—Brian E. Hearn
*Assistant Examiner*—Alan E. Schiavelli
*Attorney, Agent, or Firm*—Douglas A. Sorensen; Robert O. Groover, III; Melvin Sharp

[57] ABSTRACT

Using the present invention, a gate for a MESFET may be fabricated having a minimum gate length while having a low resistance gate. In addition, the present invention provides a method for forming a gate and gate recess which are perfectly aligned which is the optimal structure for high frequency power MESFETs. A two layer masking layer is fabricated having a first layer which may be etched uniformly and a second layer of lithographic material which may be photolithographic material such as AZ resist. A gate opening is patterned in the photoresist material and a metal such as gold is deposited by evaporation from acute angles on opposite sides of the gate opening in the resist. The deposited metal serves as a mask which covers all but a very small portion of the opening in the photoresist. The silicon nitride layer is then etched to form a gate opening and gate recess. Gate contact metal is then deposited in the opening thus formed and the nitride, photoresist and gold layers are removed, lifting off a portion of the gate metal layer thus leaving a T-shaped gate which provides a minimum length at the channel gate interface and provides a low gate resistance.

21 Claims, 8 Drawing Figures

PROCESS FOR FORMING A T-SHAPED GATE STRUCTURE

FIELD OF THE INVENTION

This invention relates to the field of integrated circuit fabrication. More specifically, this invention relates to the field of metal semiconductor field effect transistor (MESFET) fabrication.

BACKGROUND OF THE INVENTION

A goal in the fabrication of gallium arsenide power MESFETs is minimizing the gate length. Minimizing the gate length yields the benefit of faster device operation. However, prior art methods for minimizing the gate length are limited by the resolution limits of lithography methods or did not provide a method for forming the optimal gate recess for power MESFETs. In addition, an integrated circuit designer when laying out a MESFET must allow a specific buffer region between the source, the gate and the drain in order to avoid overlap between these respective regions. FIG. 1 is a side view schematic diagram of a partially formed MESFET formed using techniques known in the art. Source region 21 and drain region 22 are formed in substrate 20. Photoresist layer 23 is patterned to provide an opening 27 for forming the gate of MESFET 26. Width 24 is the smallest opening capable of being patterned using the photolithographic technique used to pattern photoresist layer 23. Widths 25 are the deviation tolerances and are included to insure that the gate formed using photoresist layer 23 does not make contact with either source region 21 or drain region 22 and thus short the gate to the drain. Thus the narrowest gate length which may be fabricated using this prior art technique is width 24. In addition, this prior art method for forming a MESFET can only form a transistor having a minimum gate width of width 24 plus two width 25s.

Because of this limitation, it is an object of the invention to provide a method for forming an MESFET, which includes a gate having a length shorter than the smallest opening which may be patterned using a given lithographic system. One technique for providing patterned openings smaller than those possible using lithographic techniques alone is the use of shadow deposition. Shadow deposition involves depositing a masking material at an angle over a vertical extension on the surface of the integrated circuit. The vertical extension blocks the deposition of masking material below the point where the vertical extension is interposed in the path of the deposited material, thereby providing a mask which has an opening which is the "shadow" of the vertical extension. However, prior art shadow deposition techniques do not provide a method for forming a gate and gate recess of the proper proportions for power MESFETs (i.e. having the same length).

SUMMARY OF THE INVENTION

One embodiment of the present invention provides a process whereby a gate for a MESFET may be fabricated having a minimum gate length and a gate recess of the same length. In addition, a T-shaped gate is formed. This T-shape allows use of a gate having a very narrow gate length.

A two layer masking layer is fabricated having a first layer which may be etched uniformly, such as silicon nitride, and a second layer of lithographic material which may be photolithographic material such as AZ resist. A gate opening is patterned in the photoresist material and a metal such as gold is deposited by evaporation from acute angles on opposite sides of the gate opening in the resist. The deposited metal serves as a mask which covers all but a very small portion of the opening in the photoresist. The silicon nitride layer is then etched to form a gate opening and a gate recess is etched in the substrate. Gate contact metal is then deposited in the opening thus formed and the nitride, photoresist and gold layers are removed, lifting off a portion of the gate metal layer thus leaving a T-shaped gate which provides a minimum length at the channel gate interface and provides a low resistance gate.

DETAILED DESCRIPTION

FIGS. 2A through 2E are schematic side views of the processing steps of one embodiment of the present invention. Source/drain regions 2 and 3 of e.g. N-type conductivity are formed in substrate 1 of e.g. P-type conductivity using techniques well known in the art. In an alternative embodiment source/drain regions 2 and 3 are formed on the surface of substrate 1 after the fabrication of a gate in accordance with the process of this invention. Layer 4 is a layer of material which is approximately 4000 angstroms thick and may be uniformly etched, for example a silicon nitride layer. Layer 5 is a lithographic material such as AZ photolithographic resist approximately 0.5 to 1.0 microns thick which has been patterned using techniques well known in the art to provide the opening shown in photolithographic layer 5.

Figure 2A:
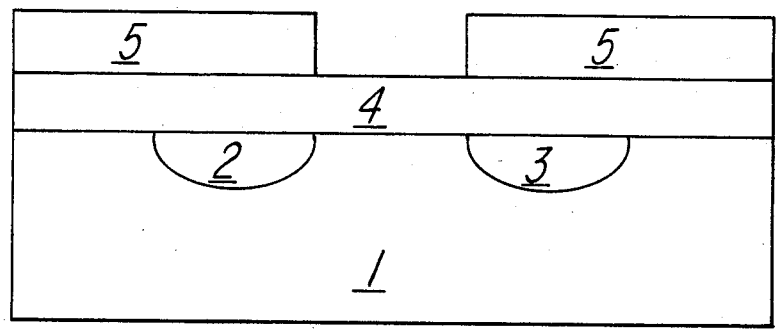
FIGS. 2A through 2E are schematic side view diagrams depicting one embodiment of the process of this invention.
Figure 2B:
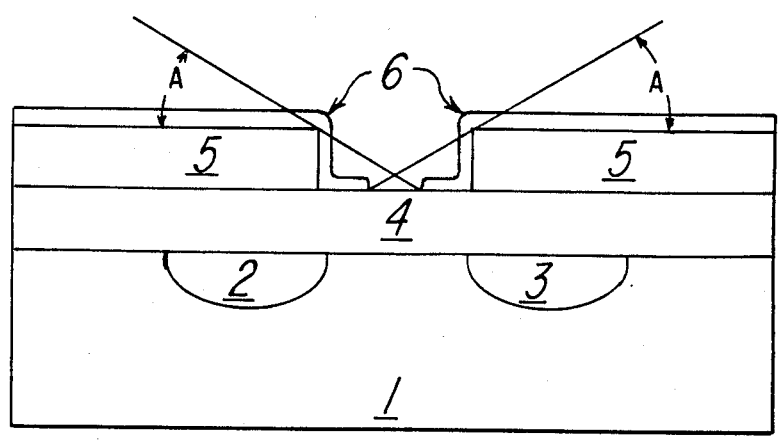

The structure of FIG. 2A is subjected to an evaporation of a metal such as gold which is deposited from acute angles A, which in this instance is approximately 60 degrees, in order to form metal layer 6 of FIG. 2B which is approximately 1500 angstroms thick. Acute angles A are chosen so that a small opening remains on the surface of silicon nitride layer 4. Gold layer 6 serves as a mask for etching silicon nitride layer 4. The size of this opening may be controlled by altering angles A or the thickness of photoresist layer 5.

Figure 2C:
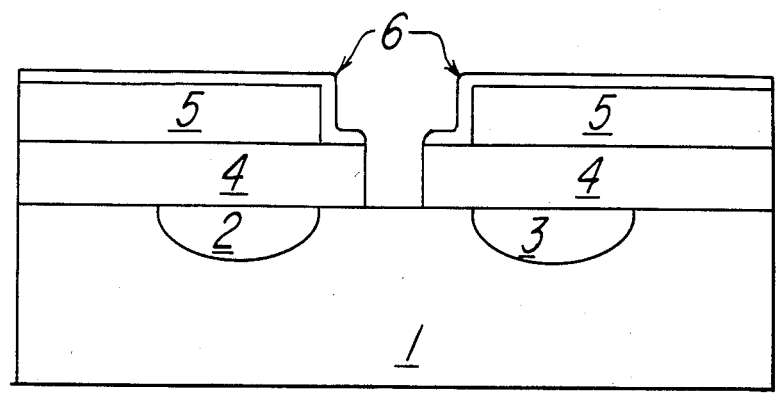
Figure 2D:
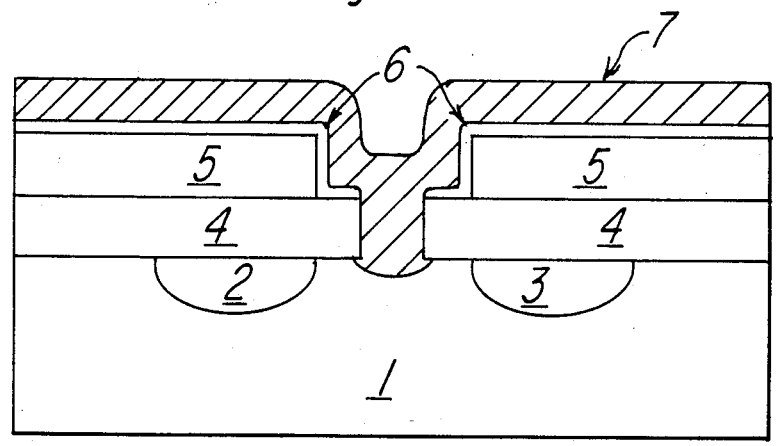
Figure 2E:
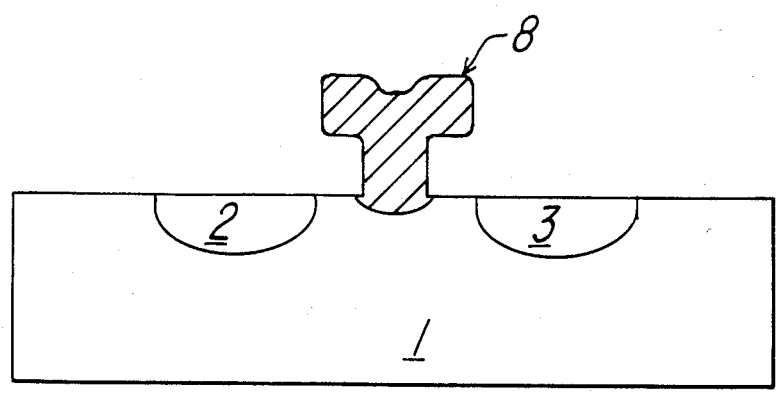

Silicon nitride layer 4 is then etched using a plasma etching process to provide an opening through silicon nitride layer 4 as shown in FIG. 2C. Substrate 1 is then partially etched using a chemical etching process to provide an appropriate gate recess in substrate 1. Metal layer 7 is deposited using techniques well known in the art in order to fill the opening through silicon nitride layer 4 as shown in FIG. 2D. Photoresist layer 5, silicon nitride layer 4 and gold layer 6 are then removed using techniques well known in the art. As these layers are removed, portions of metal layer 7 are lifted off leaving T-shaped gate structure 8 as shown in FIG. 2E.

Figure 1:
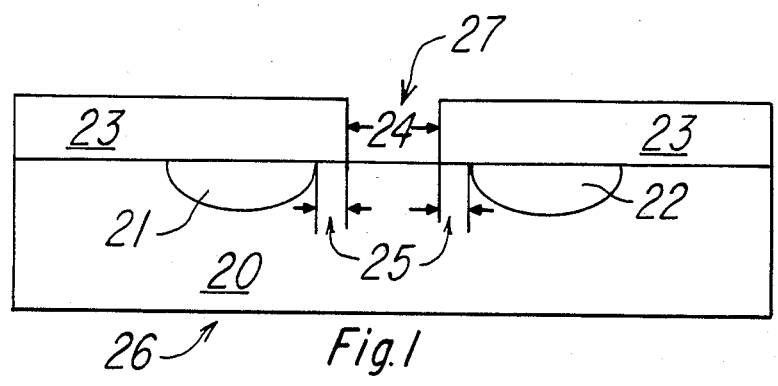
FIG. 1 is a schematic side view diagram depicting a processing step in the prior art for forming a gate in a MESFET.

Using the described process, source region 2 and drain region 3 may be formed in substrate 1 having a spacing between these respective regions equal to the minimum spacing tolerance of the photolithographic techniques used to pattern photoresist layer 5 plus the gate contact width of T-shaped gate 8, which is much smaller than the opening in photresist layer 5. This compares with the prior art which required that the minimum spacing tolerance must be maintained between source region 2 and gate region 8, a minimum tolerance must be maintained between gate region 8 and drain region 3 and a gate contact area equal to opening 27 in photoresist layer 23 (FIG. 1). Thus a MESFET fabricated using the process of this invention may be smaller than MESFET's designed according to the prior art. In addition, T-shaped gate 8 is formed having a minimum gate contact length, in an appropriate gate recess and with a wide upper area which provides a low resistance gate.

Figure 3A:
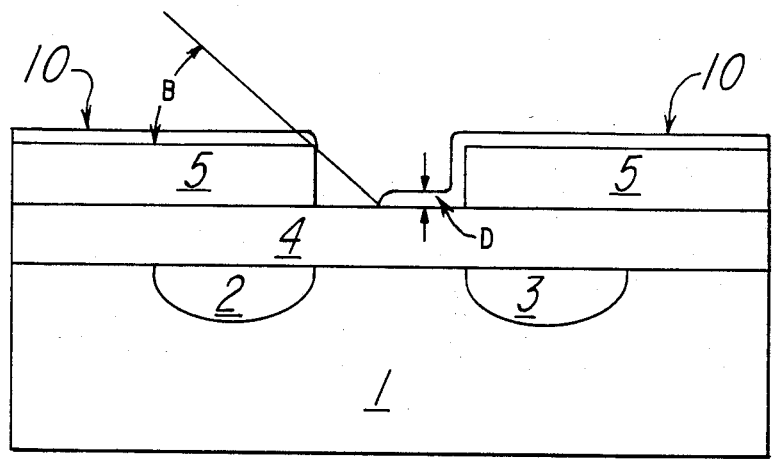
FIGS. 3A and 3B are side view schematic drawings depicting two of the steps required for a second embodiment of the present invention.
Figure 3B:
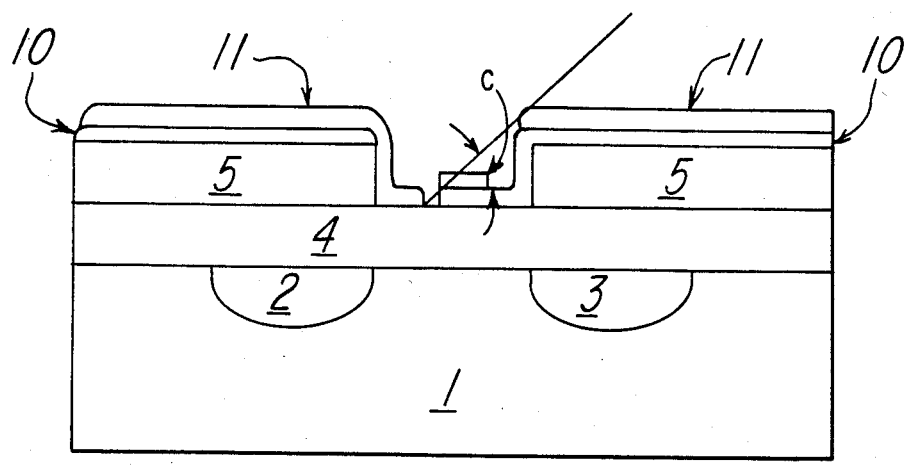

FIGS. 3A and 3B are schematic side view diagrams depicting substitute process steps for the step of FIG. 2B. Components in FIGS. 3A and 3B having the same identification number as components in FIGS. 2A through 2E perform the same function as described with regard to FIGS. 2A through 2E. On the structure shown in FIG. 2A, gold layer 10 is deposited by evaporation from a source at an acute angle B to a thickness d of approximately 1,000 angstroms to provide the structure as shown in FIG. 3A. A second metal layer is deposited at acute angle C to provide metal layer 11 as shown in FIG. 3B. Metal layer 10 prevents the deposition of metal layer 11 on the surface of silicon nitride layer 4 at a region to the left of metal layer 10 as shown in FIG. 3B. Because metal layer 10 may be deposited with a much more accurately monitorable thickness than photoresist layer 5 and it is adjacent to the opening being formed, a more narrow opening may be formed on the surface of silicon nitride layer 4 by using gold layers 10 and 11 than by using the step described with regard to FIG. 2B. Silicon nitride layer 4 is then etched to provide a gate opening and a gate is formed using the processing steps described with regard to FIGS. 2C through 2D.

Although this specification describes specific embodiments of the present invention, it is not to be construed as limiting the scope of the invention. Other embodiments will become apparent to those skilled in the art in light of the teachings of this invention. For example, although the described embodiments provide methods for fabricating MESFETs, the principles of this invention could be applied to the fabrication of metal-oxide field effect transistors (MOSFETs).

TECHNICAL ADVANTAGES

The present invention provides a method of forming MESFET devices having much smaller dimensions than those allowed by present lithographic techniques. The present invention allows a T-shaped gate which provides a narrow gate channel junction area while still providing a low resistance gate. Using the techniques of this process in conjunction with photolithographic techniques, a gate having quarter-micron geometries may be fabricated. In addition, the present invention provides a gate contact area an gate recess which are shorter than those provide in the prior art and which are perfectly aligned to each other. This provides a gate which optimally designed for high frequency power MESFETs.

We claim:

1. A process for forming a T-shaped gate structure, comprising the steps of:
   providing a substrate;
   forming a first masking layer on the surface of said substrate;
   forming a second masking layer on the surface of said first masking layer;
   patterning said second masking layer;
   depositing a masking material on the surface of said first and second masking layers from a deposition source at an acute angle relative to the surface of said first and second masking layers thereby depositing a third masking layer on the surface of said first and second masking layers having an opening much smaller than and within the opening provided by said patterned second masking layer;
   etching the portion of said first masking layer exposed by said smaller opening in said third masking layer to said substrate;
   depositing gate material on the surfaces of said substrate and said first, second and third masking layers;
   removing said first, second and third masking layers thereby lifting off a portion of said deposited gate material.

2. A process as in claim 1 wherein said substrate is formed of crystalline gallium arsenide.

3. A process as in claim 1, further comprising the step of etching a gate recess in said substrate.

4. A process for forming a T-shaped gate structure, comprising the steps of:
   providing a substrate;
   forming a silicon nitride layer on the surface of said substrate;
   forming and patterning a resist layer on the surface of said silicon nitride layer;
   depositing metal material on the surface of said silicon nitride and resist masking layers from a deposition source at an angle relative to the surface of said substrate thereby depositing a metal masking layer on the surface of said silicon nitride and resist layers having an opening much smaller than and within the opening provided by said patterned resist layer;
   etching the portion of said silicon nitride layer exposed by said smaller opening in said metal masking layer to said substrate;
   depositing gate metal on the surfaces of said substrate and said silicon nitride, resist and metal layers;
   removing said silicon nitride, resist and metal layers thereby lifting off a portion of said deposited gate metal.

5. A process as in claim 4 wherein said substrate is formed of crystalline gallium arsenide.

6. A process as in claim 4 wherein said resist is photoresist.

7. A process as in claim 4, further comprising the step of
   etching a gate recess in said substrate.

8. A process for forming a metal semiconductor field effect transistor having a T-shaped gate structure, comprising the steps of:
   providing a substrate;
   forming source and drain areas in said substrate;
   forming a first masking layer on the surface of said substrate;
   forming a second masking layer on the surface of said first masking layer;

patterning said second masking layer to provide a gate opening pattern above the region between said source and drain;

depositing a masking material on the surface of said first and second masking layers from a deposition source at an acute angle relative to the surface of said first and second masking layers thereby depositing a third masking layer on the surface of said first and second masking layers having an opening much smaller than and within the opening provided by said patterned second masking layer;

etching the portion of said first masking layer exposed by said smaller opening in said third masking layer to said substrate; depositing gate material on the surfaces of said substrate and said first, second and third masking layers;

removing said first, second and third masking layers thereby lifting off a portion of said deposited gate material.

9. A process as in claim 8 wherein said substrate has a conductivity type of P and said source and drain have a conductivity type of N.

10. A process as in claim 8 wherein said first masking layer is a silicon nitride layer.

11. A process as in claim 8 second masking layer is a layer of resist material.

12. A process as in claim 8 wherein said masking material is gold.

13. A process as in claim 8 wherein said masking material is deposited by evaporation.

14. A process as in claim 8, further comprising the step of etching a gate recess in said substrate.

15. A process for forming a metal semiconductor field effect transistor having a T-shaped gate structure, comprising the steps of:

providing a substrate;

forming a first masking layer on the surface of said substrate;

forming a second masking layer on the surface of said first masking layer;

patterning said second masking layer to provide a gate opening pattern above the region between said source and drain;

depositing a masking material on the surface of said first and second masking layers from a deposition source at an acute angle relative to the surface of said first and second masking layers thereby depositing a third masking layer on the surface of said first and second masking layers having an opening much smaller than and within the opening provided by said patterned second masking layer;

etching the portion of said first masking layer exposed by said smaller opening in said third masking layer to said substrate;

depositing gate material on the surfaces of said substrate and said first, second and third masking layers;

removing said first, second and third masking layers thereby lifting off a portion of said deposited gate material;

forming source and drain regions on opposite sides of the remaining portion of said deposited gate material on the surface of said substrate.

16. A process as in claim 15 wherein said substrate has a conductivity type of P and said source and drain have a conductivity type of N.

17. A process as in claim 15 wherein said first masking layer is a silicon nitride layer.

18. A process as in claim 15 second masking layer is a layer of resist material.

19. A process as in claim 15 wherein said masking material is gold.

20. A process as in claim 15 wherein said masking material is deposited by evaporation.

21. A process as in claim 15, further comprising the step of etching a gate recess in said substrate.

* * * * *